United States Patent
Ohgoh

(10) Patent No.: US 7,295,587 B2
(45) Date of Patent: Nov. 13, 2007

(54) SEMICONDUCTOR LASER HAVING OPTICAL GUIDE LAYER DOPED FOR DECREASING RESISTANCE

(75) Inventor: Tsuyoshi Ohgoh, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 40 days.

(21) Appl. No.: 11/386,717

(22) Filed: Mar. 23, 2006

(65) Prior Publication Data
US 2006/0220002 A1    Oct. 5, 2006

(30) Foreign Application Priority Data
Mar. 23, 2005    (JP)    ............................. 2005-082862

(51) Int. Cl.
*H01S 5/00*    (2006.01)
(52) U.S. Cl. .................. 372/45.01; 372/43.01
(58) Field of Classification Search ............. 372/45.01, 372/46.01, 43.01, 75
See application file for complete search history.

(56) References Cited

U.S. PATENT DOCUMENTS 5,345,463 A * 9/1994 Mannoh et al. ........ 372/45.012
6,798,808 B1 * 9/2004 Konushi et al. ....... 372/45.013

* cited by examiner

*Primary Examiner*—Minsun Oh Harvey
*Assistant Examiner*—Tuan N. Nguyen
(74) *Attorney, Agent, or Firm*—Sughrue Mion Pllc.

(57) ABSTRACT

In a semiconductor laser element: a lower cladding layer of a first conductivity type, a quantum-well active layer, an upper cladding layer of a second conductivity type, a contact layer of the second conductivity type, and a first electrode of the second conductivity type are formed in this order above a surface of a semiconductor substrate of the first conductivity type, and a second electrode of the first conductivity type is formed below the lower cladding layer. An optical guide layer is arranged between the quantum-well active layer and one or each of the lower cladding layer and the upper cladding layer. The whole or a portion of the optical guide layer contains a dopant so as to realize a carrier concentration of $3.0 \times 10^{17}$ cm$^{-3}$ or higher.

5 Claims, 1 Drawing Sheet

CARRIER CONCENTRATION IN OPTICAL GUIDE LAYER (cm$^{-3}$)

SEMICONDUCTOR LASER HAVING OPTICAL GUIDE LAYER DOPED FOR DECREASING RESISTANCE

BACKGROUND OF THE INVENTION

1. Field of the Invention

The present invention relates to a semiconductor laser element, and in particular to an InAlGaP-based semiconductor laser element.

2. Description of the Related Art

Currently, POFs (plastic optical fibers) are receiving attention in the field of the broadband home networks, in the industrial fields (for transmission of various signals), and the like. Although the transmission rates through the POFs are currently approximately 100 Mbps, there are demands for further increase in the transmission rate in order to increase the amount of transmitted information. In addition, since InAlGaP-based semiconductor laser elements emit light in the 650 nm band, and the POFs exhibit low loss in the 650 nm band, the InAlGaP-based semiconductor laser elements are considered to be used as light sources with the POFs.

U.S. Pat. Nos. 5,345,463 and 6,798,808 disclose structures for improving the high-speed modulation characteristics of InAlGaP-based semiconductor laser elements. In the disclosed structures, a first p-type cladding layer is formed on a semiconductor active layer, an n-type current-blocking layer having an opening is formed on the first p-type cladding layer, and a second p-type cladding layer is formed in the opening so that a current-confinement region is realized by a backward-bias structure formed with the n-type current-blocking layer and the second p-type cladding layer. In addition, a p-type contact layer is formed on the current-confinement region, and the semiconductor active layer is realized by, for example, a laminated structure formed of a first optical guide layer, an i-type multiple-quantum-well active layer, and a second optical guide layer.

The diffusion coefficient of zinc as a p-type dopant is greater in the InAlGaP-based material than in the As-based material such as the AlGaAs-based material, so that there is a tendency that the p-type dopant can readily diffuse in a crystal during crystal growth or heat treatment of the p-type cladding layer. However, if the p-type dopant diffuses to the semiconductor active layer, the p-type dopant can produce non-radiative recombination centers in the active layer, so that the characteristics of the semiconductor laser element deteriorate, for example, the lifetime of the semiconductor laser element is reduced. U.S. Pat. No. 5,345,463 proposes formation of an antidiffusion layer (which is undoped or has a low carrier concentration) in a vicinity of the active layer during formation of the first p-type cladding layer in order to prevent diffusion of the p-type dopant into the semiconductor active layer.

In addition, the InAlGaP-based material has greater electric resistance and thermal resistance than the AlGaAs-based material and the like, so that there is a tendency that the InAlGaP-based semiconductor laser element requires higher driving current and generates greater heat than the semiconductor laser element made of AlGaAs-based material and the like. Further, U.S. Pat. No. 6,798,808 proposes high concentration doping in the p-type cladding layers for lowering the element resistance of the semiconductor laser element.

Although the optical guide layers are also made of an InAlGaP-based material, doping in the optical guide layers has not been proposed for the following reasons, which are indicated in U.S. Pat. No. 6,798,808.

(1) Conventionally, it has been considered that when the optical guide layer is doped, the function of an optical guide layer preventing diffusion of the dopant from the p-type cladding layers into the quantum-well active layer deteriorates.

(2) Conventionally, it has been considered that when the dopant diffuses from the p-type cladding layers into the optical guide layer, and the carrier concentration in the optical guide layer becomes high, defects produced in the optical guide layer by the diffused dopant become non-radiative recombination centers, and the characteristics of the semiconductor laser element deteriorates, since a greater portion of light is distributed in the optical guide layer than in the p-type cladding layers.

For the above reasons (1) and (2), conventionally, it has been considered that deterioration in the characteristics of the semiconductor laser element becomes more serious (i.e., the lifetime of the semiconductor laser element is reduced) when the carrier concentration in the optical guide layer becomes higher.

As described above, in the structure disclosed in U.S. Pat. No. 6,798,808, the p-type cladding layers are doped with high concentration dopant. Although this technique is effective in reducing the element resistance of the semiconductor laser element, the effect is insufficient. Therefore, further reduction in the element resistance of the semiconductor laser element is required.

SUMMARY OF THE INVENTION

The present invention has been developed in view of the above circumstances.

The object of the present invention is to provide an InAlGaP-based semiconductor laser element which has a sufficiently long lifetime and reduced element resistance (electric and thermal resistance).

(I) In order to accomplish the above object, the first aspect of the present invention is provided. According to the first aspect of the present invention, there is provided a semiconductor laser element comprising: a semiconductor substrate of a first conductivity type; a lower cladding layer of the first conductivity type formed above a surface of the semiconductor substrate; an optical guide layer formed above the lower cladding layer; a quantum-well active layer formed above the optical guide layer; an upper cladding layer of a second conductivity type formed above the quantum-well active layer; a contact layer of the second conductivity type formed above the upper cladding layer; a first electrode of the first conductivity type formed below the lower cladding layer; and a second electrode of the second conductivity type formed on the contact layer. The optical guide layer has a bandgap smaller than a bandgap which the lower cladding layer has, and the whole or a portion of the optical guide layer contains a dopant so as to realize a carrier concentration of $3.0 \times 10^{17}$ $cm^{-3}$ or higher.

In order to accomplish the aforementioned object, the second aspect of the present invention is also provided. According to the second aspect of the present invention, there is provided a semiconductor laser element comprising: a semiconductor substrate of a first conductivity type; a lower cladding layer of the first conductivity type formed above a surface of the semiconductor substrate; a quantum-well active layer formed above the lower cladding layer; an optical guide layer formed above the quantum-well active layer; an upper cladding layer of a second conductivity type formed above the optical guide layer; a contact layer of the second conductivity type formed above the upper cladding layer; a first electrode of the first conductivity type formed below the lower cladding layer; and a second electrode of the second conductivity type formed on the contact layer. The optical guide layer has a bandgap smaller than a bandgap which the lower cladding layer has, and the whole or a portion of the optical guide layer contains a dopant so as to realize a carrier concentration of $3.0 \times 10^{17}$ cm$^{-3}$ or higher.

In the first and second aspects of the present invention, the first and second conductivity types are different conductivity types. For example, when the first conductivity type is the n-type, the second conductivity type is the p-type, and vice versa.

Preferably, the semiconductor laser element according to each of the first and second aspects of the present invention may also have one or any possible combination of the following additional features (i) to (vii).

(i) The semiconductor substrate is made of an n-type GaAs substrate in which the principal plane has a crystal orientation tilted 10 to 15 degrees from the (100) face toward the [111] direction.

(ii) The lower cladding layer of the first conductivity type is made of n-type $In_x(Al_{1-y1}Ga_{y1})_{1-x}P$.

(iii) The quantum-well active layer is made of InGaP and/or InAlGaP.

(iv) The optical guide layer is made of $In_x(Al_{1-y2}Ga_{y2})_{1-x}P$.

The compositions x, y1, and y2 in the lower cladding layer and the optical guide layer are such that each of the lower cladding layer and the optical guide layer lattice-matches with GaAs, and y1<y2.

(v) The second electrode may be formed on either of the upper and lower surfaces of the semiconductor substrate.

(vi) The first conductivity type is the n-type, the second conductivity type is the p-type, the dopant is zinc, and the carrier concentration in the whole or the portion of the optical guide layer is $2.0 \times 10^{18}$ cm$^{-3}$ or lower.

(vii) In the semiconductor laser element according to the first aspect of the present invention, preferably, the first conductivity type is the n-type, the second conductivity type is the p-type, the dopant is a p-type dopant, and the whole or a portion of the lower cladding layer contains the dopant so as to realize a carrier concentration of $2.0 \times 10^{16}$ cm$^{-3}$ to $2.0 \times 10^{18}$ cm$^{-3}$.

(II) The advantages of the present invention are described below.

The present inventor has found that when the output power is as low as approximately 5 mW (which is equal to a power level excepted to be used in the POF communication), it is possible to dope an optical guide layer in an InAlGaP-based semiconductor laser element so as to reduce the element resistance while maintaining a sufficiently long lifetime. In addition, as mentioned before, conventionally, it has been considered that deterioration in the characteristics of the semiconductor laser element becomes more serious (i.e., the lifetime of the semiconductor laser element is reduced) when the carrier concentration in the optical guide layer becomes higher. However, the present inventor has found that in a certain range of carrier concentrations, contrary to the conventional understanding, the lifetime of the semiconductor laser element is increased by doping the optical guide layer.

Further, the present inventor has found that the lifetime characteristic in the case where the optical guide layer is intentionally doped (as in the present invention) is different from the lifetime characteristic in the case where the dopant diffuses from a cladding layer into the optical guide layer (which is mentioned as a problem in U.S. Pat. No. 6,798,808). Although the reason for the above difference is not yet established, the present inventor considers the reason as follows.

When a crystal is doped with a dopant, most of the dopant atoms fit into the crystal lattice and produce carriers. However, part of the dopant atoms do not fit into the crystal lattice and become interlattice atoms which do not produce carriers. Since the interlattice atoms are located at position which are different from the lattice positions, and can produce crystal defects. In addition, the interlattice atoms are in instable states. Therefore, when the doped crystal is heated, the interlattice atoms are likely to diffuse to a region in which the carrier concentration is low. When the interlattice atoms intrude into the active layer, the interlattice atoms can cause defects and produce non-radiative recombination centers.

The present inventor considers that when a first optical guide layer intentionally doped with a dopant and a second optical guide layer into which the same dopant has intruded have an identical concentration of the dopant atoms, the amount of interlattice atoms in the first optical guide layer is different from the amount of interlattice atoms in the second optical guide layer, and therefore the rate of production of non-radiative recombination centers is different between the first and second optical guide layers, so that the lifetime of the semiconductor laser element having the first optical guide layer is different from the lifetime of the semiconductor laser element having the second optical guide layer. That is, since the optical guide layer in the semiconductor laser element according to the first or second aspect of the present invention is intentionally doped, the present inventor considers that the rate of production of non-radiative recombination centers in the optical guide layer in the semiconductor laser element according to the first or second aspect of the present invention is not so high, and the driving voltage, the hear generation, and the like are suppressed by the reduction of the element resistance realized by the doping, so that the lifetime of the semiconductor laser element according to the present invention is long.

The optical guide layer in each of the semiconductor laser elements according to the first and second aspects of the present invention is intentionally doped so that the carrier concentration in the whole or a portion of the optical guide layer becomes $3.0 \times 10^{17}$ cm$^{-3}$ or higher, while the carrier concentrations in the optical guide layers in the conventional semiconductor laser elements (which are not doped) are $5.0 \times 10^{16}$ cm$^{-3}$ (which is currently the detection limit) or lower. Therefore, the element resistance (electric and thermal resistance) of each of the semiconductor laser elements according to the first and second aspects of the present invention is reduced, and thus the semiconductor laser element can be driven at low voltage, so that heat generation during operation can be reduced, and the semiconductor laser elements according to the first and second aspects of the present invention become highly reliable.

In particular, when the semiconductor laser elements according to the first and second aspects of the present invention operate at an output power level as low as approximately 5 mW (which is equal to a power level excepted to be used in the POF communication), it is possible to realize a sufficiently long lifetime even when the optical guide layer is doped. Further, it is possible to realize an InAlGaP-based semiconductor laser element having a longer lifetime than the conventional semiconductor laser elements, in which the optical guide layer is not doped.

Furthermore, the present inventor has found a tendency that the lifetime of the semiconductor laser element decreases when the carrier concentration in the optical guide layer exceeds a certain limit. Even when the optical guide layer is intentionally doped with dopant atoms, part of the dopant atoms become interlattice atoms. Therefore, the present inventor considers that when the amount of dopant atoms exceeds a certain limit, the rate of production of non-radiative recombination centers becomes high, so that the lifetime of the semiconductor laser element decreases. Thus, the aforementioned additional features (vi) and (vii) are effective.

DESCRIPTION OF PREFERRED EMBODIMENTS

An embodiment of the present invention is explained in detail below with reference to drawings.

Structure of Embodiment

Figure 1:
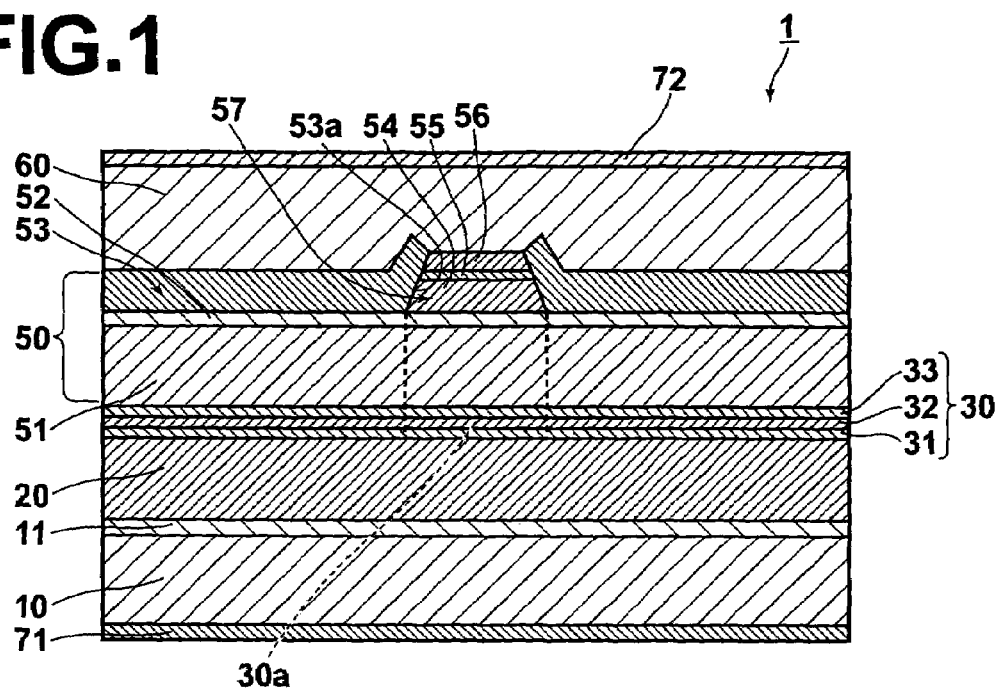
FIG. 1 is a schematic cross-sectional view of a semiconductor laser element according to an embodiment of the present invention.

First, the structure of the semiconductor laser element according to the present embodiment is explained below. FIG. 1 is a cross-sectional view of an InAlGaP-based semiconductor laser element according to an embodiment of the present invention. The semiconductor laser element 1 of FIG. 1 has an oscillation wavelength of 650 to 670 nm, which corresponds to a wavelength range in which the plastic optical fibers exhibit low loss.

In the semiconductor laser element 1, an n-type buffer layer 11, an n-type cladding layer 20, a semiconductor active layer 30, a current-confinement structure 50, a p-type contact layer 60, and a p-type electrode 72 are formed in this order on an upper surface of an n-type semiconductor substrate 10. In addition, an n-type electrode 71 is formed on the lower surface of the semiconductor substrate 10. The current-confinement structure 50 is arranged for injecting current into a specific region of the semiconductor active layer 30. The semiconductor active layer 30 is sandwiched between the n-type cladding layer 20 and a p-type cladding layer 51, which constitutes the current-confinement structure 50.

The semiconductor substrate 10 is an off-angled substrate of n-type GaAs in which the principal plane has a crystal orientation tilted 10 to 15 degrees from the (100) face toward the [111] direction. The n-type cladding layer 20 is made of n-type $In_{0.49}(Al_{0.7}Ga_{0.3})_{0.51}P$, and the n-type buffer layer 11 is made of n-type GaAs.

The semiconductor active layer 30 has a laminated structure of a first optical guide layer 31, an i-type quantum-well active layer 32, and a second optical guide layer 33, which are formed in this order on the n-type cladding layer 20. The first optical guide layer 31 is made of p-type $In_{0.49}(Al_{0.5}Ga_{0.5})_{0.51}P$, and has a bandgap smaller than the bandgap of the n-type cladding layer 20. The i-type quantum-well active layer 32 is made of InGaP and/or InAlGaP. Preferably, the i-type quantum-well active layer 32 is a multiple-quantum-well active layer constituted by one or more i-type InGaP quantum-well sublayers and one or more i-type AlGaInP barrier layers. The i-type quantum-well active layer 32 may be either unstrained or strained. When the i-type quantum-well active layer 32 is strained, the i-type quantum-well active layer 32 may have compressed strain. The second optical guide layer 33 is made of p-type $In_{0.49}(Al_{0.5}Ga_{0.5})_{0.51}P$, and has a bandgap greater than the bandgap of the i-type quantum-well active layer 32.

According to the present embodiment, the first and second optical guide layers 31 and 33 are doped, while the optical guide layers in the conventional semiconductor laser elements are not doped. The characteristic feature of the present embodiment is that the whole or a portion of each of the first and second optical guide layers 31 and 33 contains dopant atoms realizing the carrier concentration of $3.0 \times 10^{17}$ cm$^{-3}$ or higher, and preferably $5.0 \times 10^{17}$ cm$^{-3}$ or higher. The dopant in the first and second optical guide layers 31 and 33 may be either p-type (e.g., Zn or Mg) or n-type (e.g., Si). It is possible to dope the first and second optical guide layers 31 and 33 with an identical dopant, or dope one or each of the first and second optical guide layers 31 and 33 with a plurality of dopants.

The present inventor has made the following findings (a) and (b).

(a) When the carrier concentrations in the first and second optical guide layers 31 and 33 are $3.0 \times 10^{17}$ cm$^{-3}$ or higher, and preferably $5.0 \times 10^{17}$ cm$^{-3}$ or higher, it is possible to satisfactorily reduce the element resistance, and produce a semiconductor laser element having a longer lifetime than the conventional semiconductor laser elements. For example, the estimated lifetime of the semiconductor laser element according to the present embodiment is 30,000 hours or longer.

(b) The preferable upper limit of the carrier concentration in the first and second optical guide layers 31 and 33 depends on the type of the dopant. In addition, when the carrier concentration of one of the first and second optical guide layers 31 and 33 exceeds a certain limit, the characteristics of the semiconductor laser element deteriorate, and the lifetime of the semiconductor laser element decreases. In the case where each of the first and second optical guide layers 31 and 33 is doped with zinc as the p-type dopant, it is possible to obtain a semiconductor laser element having a lifetime longer than the lifetimes of the conventional semiconductor laser elements, by keeping the carrier concentration in the portion which is doped with the dopant at $2.0 \times 10^{18}$ cm$^{-3}$ or lower. The upper limit of the allowable carrier concentration in the case where the dopant is magnesium or silicon is higher than the upper limit in the case where the dopant is zinc, since the activation efficiency of magnesium or silicon with regard to carrier production is greater than the activation efficiency of zinc.

Since the first and second optical guide layers 31 and 33 are doped, part of dopant atoms with which the first optical guide layer 31 is doped diffuse into the n-type cladding layer 20, which is located adjacent to the first optical guide layer 31. In the case where the first optical guide layer 31 is doped with p-type dopant atoms, the whole or a portion of the n-type cladding layer 20 contains part of the p-type dopant atoms realizing the carrier concentration in the range of $2.0 \times 10^{16}$ cm$^{-3}$ or $2.0 \times 10^{18}$ cm$^{-3}$. The present inventor has confirmed that the function of the n-type cladding layer 20 and the lifetime of the semiconductor laser element are not affected by the existence of the dopant atoms in the n-type cladding layer 20 when the carrier concentration of the p-type dopant atoms in the n-type cladding layer 20 is in the above range.

The current-confinement structure 50 comprises the p-type cladding layer 51, a p-type etching-stop layer 52, an n-type current-stopping layer 53, and a p-type second cladding layer 54. The n-type current-stopping layer 53 has an opening 53a for current confinement, and the p-type second cladding layer 54 is formed in the opening 53a so that the n-type current-stopping layer 53 and the p-type second cladding layer 54 realizes a backward-bias structure. The p-type etching-stop layer 52 is formed between the p-type cladding layer 51 and the n-type current-stopping layer 53.

In addition, a p-type hetero-buffer layer 55 and a p-type cap layer 56 are formed in this order on the p-type second cladding layer 54. The p-type second cladding layer 54, the p-type hetero-buffer layer 55, and the p-type cap layer 56 are formed in only the opening 53a so as to form a ridge structure 57 protruding above the p-type etching-stop layer 52, which is located under the bottom of the ridge structure 57.

In the current-confinement structure 50, current selectively flows through the p-type second cladding layer 54 filling the opening 53a. Therefore, the current is selectively injected into a specific region 30a of the semiconductor active layer 30 located under the p-type second cladding layer 54. Hereinafter, the specific region 30a is called the current-injection region.

In the semiconductor laser element according to the present embodiment, the current-injection region 30a has a stripelike shape in a horizontal cross section, and extends in the direction of the laser resonator. Therefore, each of the p-type second cladding layer 54, the p-type hetero-buffer layer 55, and the p-type cap layer 56 has a horizontal cross-sectional shape corresponding to the horizontal cross-sectional shape of the current-injection region 30a so that the p-type second cladding layer 54, the p-type hetero-buffer layer 55, and the p-type cap layer 56 form a mesa stripe.

The p-type cladding layer 51 is made of p-type $In_{0.49}(Al_{0.7}Ga_{0.3})_{0.51}P$, the p-type etching-stop layer 52 is made of p-type $In_{0.49}Ga_{0.51}P$, the n-type current-stopping layer 53 is made of n-type GaAs, the p-type second cladding layer 54 is made of p-type $In_{0.49}(Al_{0.7}Ga_{0.3})_{0.51}P$, the p-type hetero-buffer layer 55 is made of p-type $In_{0.49}Ga_{0.51}P$, and the p-type cap layer 56 is made of p-type GaAs.

In order to prevent diffusion of the p-type dopant atoms from the p-type cladding layer 51 to the second optical guide layer 33 and the i-type quantum-well active layer 32 during crystal growth of the p-type cladding layer 51 and the subsequent heat treatment process, it is preferable to produce an antidiffusion layer (which is undoped or has a low carrier concentration) in a vicinity of the semiconductor active layer 30 when the p-type cladding layer 51 is formed. It is preferable that the antidiffusion layer have such a thickness that an undoped region or a low-carrier-concentration region does not remain between the second optical guide layer 33 and the p-type cladding layer 51 after the process of manufacturing the semiconductor laser element is completed.

As mentioned before, the p-type contact layer 60 and the p-type electrode 72 are formed in this order on the current-confinement structure 50. The p-type contact layer 60 is made of p-type GaAs.

Advantages of Embodiment

In the InAlGaP-based semiconductor laser element according to the present embodiment, the whole or a portion of each of the first and second optical guide layers 31 and 33 contains dopant atoms realizing the carrier concentration of $3.0 \times 10^{17}$ cm$^{-3}$ or higher, and preferably $5.0 \times 10^{17}$ cm$^{-3}$ or higher. Therefore, the element resistance (electric and thermal resistance) is reduced, and therefore the semiconductor laser element can be driven at low voltage, so that heat generation during operation can be reduced. Thus, the semiconductor laser element according to the present embodiment is highly reliable.

In particular, even in the case where the optical guide layer or layers are doped, when the InAlGaP-based semiconductor laser element according to the present embodiment operates at an output power level as low as approximately 5 mW (which is equal to a power level excepted to be used in the POF communication), the lifetime of the semiconductor laser element is sufficiently long, and longer than the lifetimes of the conventional semiconductor laser elements (in which the optical guide layer is not doped).

Furthermore, it is particularly preferable that the carrier concentration in the whole or the portion of each of the first and second optical guide layers 31 and 33 which contains the p-type dopant atoms be in the range from $3.0 \times 10^{17}$ cm$^{-3}$ to $2.0 \times 10^{18}$ cm$^{-3}$. In this case, the element resistance (electric and thermal resistance) is reduced, and therefore it is possible to realize a reliable InAlGaP-based semiconductor laser element having a longer lifetime than the conventional semiconductor laser elements.

Variations of Embodiment

The semiconductor laser element according to the present invention is not limited to the above embodiment. It is possible to modify the structure of the semiconductor laser element according to the described embodiment within the scope of the invention when necessary. In particular, the layered structure, the current-confinement structure, and the composition of each layer can be varied when necessary. The following variations (1) to (6) are examples of such modifications and variations.

(1) Although the whole or a portion of each of the first and second optical guide layers 31 and 33 contains dopant atoms realizing the carrier concentration of $3.0 \times 10^{17}$ cm$^{-3}$ or higher, and preferably $5.0 \times 10^{17}$ cm$^{-3}$ or higher, according to the aforementioned embodiment, instead, it is also possible to reduce the element resistance while maintaining a sufficiently long lifetime, even when the whole or a portion of only one of the first and second optical guide layers 31 and 33 is doped so that the carrier concentration in the whole or the portion of the one of the first and second optical guide layers 31 and 33 becomes $3.0 \times 10^{17}$ cm$^{-3}$ or higher.

(2) Although the semiconductor laser element according to the described embodiment is a loss-guide type semiconductor laser element, the present invention can also be applied to any types of InAlGaP-based semiconductor laser elements including real-index-guided semiconductor laser elements, gain-guided semiconductor laser elements, and semiconductor laser elements having a diffraction grating.

(3) Although the semiconductor laser element according to the described embodiment oscillates in the fundamental transverse mode, the present invention can also be applied to wide-stripe semiconductor laser elements which oscillate in multiple modes.

(4) The present invention can be applied to bar-shaped one-dimensionally-arrayed lasers and two-dimensionally-arrayed lasers.

(5) Although, in the semiconductor laser element according to the described embodiment, the n-type electrode 71 is formed on the lower surface of the semiconductor substrate 10, instead, the n-type electrode 71 may be formed on the upper surface of the semiconductor substrate 10 since the n-type electrode 71 is merely required to be located on the lower side of the n-type cladding layer 20.

(6) Although an n-type GaAs substrate is used in the described embodiment, instead, a p-type GaAs substrate may be used. When the GaAs substrate is p-type, the conductivity types of all of the other layers in the structure of the described embodiment should be inverted.

Evaluation

Hereinbelow, the characteristics and performance of the semiconductor laser element according to the described embodiment are evaluated.

First, the lifetime of the semiconductor laser element according to the described embodiment is evaluated with respect to the carrier concentration in the optical guide layers.

The present inventor has produced a plurality of first samples of the InAlGaP-based semiconductor laser element having the structure of the described embodiment, under an identical condition except that each of the first samples is differently doped so that the carrier concentration in the first and second optical guide layers 31 and 33 in each of the first samples is different. The first and second optical guide layers 31 and 33 in each of the first samples are doped with zinc as a p-type dopant in such a manner that the carrier concentrations in the first and second optical guide layers 31 and 33 in each of the first samples are identical.

Specifically, the concrete example I of the semiconductor laser element according to the described embodiment is produced as follows.

The respective layers of the semiconductor laser element are formed by crystal growth realized by MOCVD (metal organic chemical vapor deposition), where triethyl gallium (TEG), trimethyl aluminum (TMA), trimethyl indium (TMI), arsine ($AsH_3$), and phosphine ($PH_3$) are used as raw materials, silane ($SiH_4$) is used as an n-type dopant source, and diethyl zinc (DEZ) is used as a p-type dopant source.

An off-angled substrate of n-type GaAs in which the principal plane has a crystal orientation tilted 10 to 15 degrees from the (100) face toward the [111] direction is used as the semiconductor substrate 10. The semiconductor substrate 10 undergoes a sequence of first crystal growth processes at the crystal-growth temperature of 685 to 735° C. under the pressure of 10.3 kPa. In the sequence of first crystal growth processes, an n-type buffer layer 11 (having a thickness of 0.2 micrometers and a carrier concentration of $2.0\times10^{18}$ $cm^{-3}$), an n-type cladding layer 20 (having a thickness of 1.2 micrometers and a carrier concentration of $1.0\times10^{18}$ $cm^{-3}$), a first p-type optical guide layer 31 (having a thickness of 0.08 nm), an i-type multiple-quantum-well active layer 32 of GaInP, a second p-type optical guide layer 33 (having a thickness of 0.08 nm), a first p-type cladding layer 51 (having a thickness of 0.2 micrometers and a carrier concentration of $1.0\times10^{18}$ $cm^{-3}$), a p-type etching-stop layer 52 (having a thickness of 10 nm and a carrier concentration of $1.0\times10^{18}$ $cm^{-3}$), a second p-type cladding layer 54 (having a thickness of 1.0 micrometers and a carrier concentration of $1.0\times10^{18}$ $cm^{-3}$), a p-type hetero-buffer layer 55 (having a thickness of 0.5 micrometers and a carrier concentration of $5.0\times10^{18}$ $cm^{-3}$), and a p-type cap layer 56 (having a thickness of 0.2 micrometers and a carrier concentration of $1.0\times10^{19}$ $cm^{-3}$) are formed in this order on the semiconductor substrate 10.

Subsequently, a dielectric mask of $SiO_2$ is formed for selective growth, and a ridge structure 57 (having the shape of a mesa stripe) is formed by etching the p-type second cladding layer 54, the p-type hetero-buffer layer 55, and the p-type cap layer 56.

Next, the layered structure formed as above undergoes a second crystal growth process. In the second crystal growth process, an n-type current-stopping layer 53 (having a thickness of 1.3 micrometers and a carrier concentration of $5.0\times10^{18}$ $cm^{-3}$) is formed on the upper surface of the p-type etching-stop layer 52 except the area on which the ridge structure 57 is formed.

Then, the layered structure formed as above undergoes a third crystal growth process. In the third crystal growth process, a p-type contact layer 60 (having a thickness of 2.0 micrometers and a carrier concentration of $1.0\times10^{19}$ $cm^{-3}$) is formed over the entire upper surface of the ridge structure 57 and the entire upper surface of the n-type current-stopping layer 53.

Thereafter, the back side of the n-type GaAs substrate 1 is polished until the total thickness of the structure layered as above becomes approximately 100 micrometers, and the n-type electrode 71 is formed on the back (lower) surface by evaporation and heat treatment. Similarly, the p-type electrode 72 is formed on the p-type contact layer 60.

Finally, laser bars realizing the resonator length of about 0.5 to 1.5 mm are cut out by cleavage from the layered structure formed as above. Subsequently, the opposite cleaved faces of each laser bar are coated with a low-reflectance optical film and a high-reflectance optical film, respectively. Thereafter, each laser bar is divided into chips by cleavage. Thus, the production of the loss-guide type, InAlGaP-based semiconductor laser element which oscillate in a single mode is completed.

In order to evaluate the characteristics and performance of the samples produced as above, the present inventor has performed a life test for each of the above first samples. In the life test, each of the first samples is APC (Automatic Power Control) driven at 50° C. with the output power of 5 mW, and a time which elapses until the driving current of each of the first samples increases to 1.2 times the initial driving current is obtained as an estimated lifetime. In addition, the carrier concentrations in the first and second optical guide layers 31 and 33 have been measured by secondary ion mass spectrometry (SIMS). The measured carrier concentrations in the first and second optical guide layers 31 and 33 in the tested samples ranges from $2.0\times10^{17}$ $cm^{-3}$ to $3.0\times10^{18}$ $cm^{-3}$. That is, the range of the carrier concentrations in the first and second optical guide layers 31 and 33 in the produced samples covers and is wider than the aforementioned preferable range of the carrier concentrations in the optical guide layers according to the described embodiment.

Figure 2:
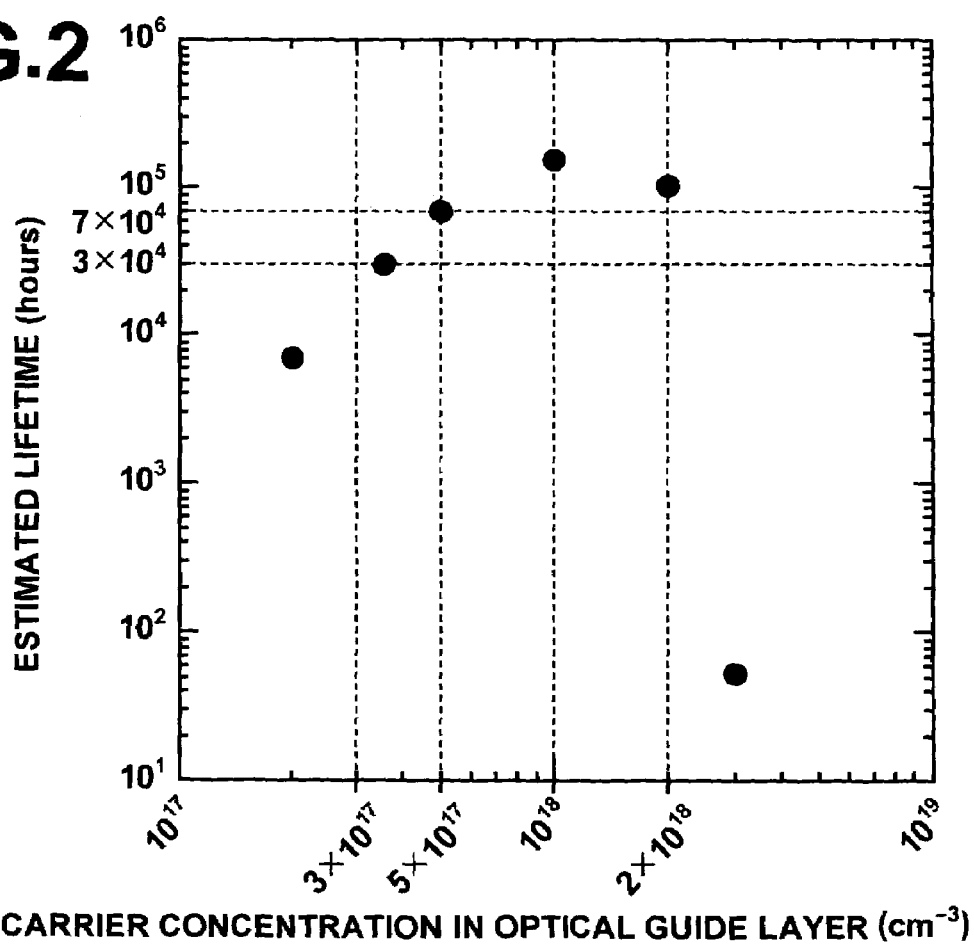
FIG. 2 is a graph indicating a relationship between the estimated lifetimes and the carrier concentrations in the optical guide layers in samples of the semiconductor laser element produced for evaluation.

The results of the above life test is indicated in FIG. 2, which is a graph indicating a relationship between the estimated lifetimes and the carrier concentrations in the optical guide layers in the samples of the semiconductor laser element produced for evaluation.

In addition, for comparison, the present inventor has performed the same life test for commercially available InAlGaP-based semiconductor laser elements which emit low-power light in the wavelength range of 650 to 670 nm, and obtained the values of approximately 5,000 to 10,000 hours as the estimated lifetimes of the conventional InAlGaP-based semiconductor laser elements. As mentioned before, the carrier concentrations in the optical guide layers in the conventional semiconductor laser elements (which are not doped) are $5.0\times10^{16}$ $cm^{-3}$ (which is currently the detection limit) or lower.

As indicated in FIG. 2, in a certain range of the carrier concentrations, contrary to the conventional understanding, the lifetime of the semiconductor laser element increases with the carrier concentration in the optical guide layers, although it has been conventionally considered that the lifetime of the semiconductor laser element decreases with the carrier concentration in the optical guide layers as mentioned before with reference to U.S. Pat. No. 6,798,808.

Specifically, in the first samples in which the optical guide layers are doped with zinc, the lifetime is maximized when the carrier concentration in the optical guide layers is $1.0 \times 10^{18}$ cm$^{-3}$, and the lifetime of the semiconductor laser element decreases with increase in the difference in the carrier concentration from the value of $1.0 \times 10^{18}$ cm$^{-3}$.

In addition, FIG. 2 indicates that when the carrier concentration in the optical guide layers is in the range from $3.0 \times 10^{17}$ cm$^{-3}$ to $2.0 \times 10^{18}$ cm$^{-3}$, the estimated lifetimes of the first examples of the semiconductor laser element are approximately 30,000 hours or more, and are longer than the lifetimes of the conventional semiconductor laser elements (in which the optical guide layers are not doped). In particular, when the carrier concentration in the optical guide layers is in the range from $5.0 \times 10^{17}$ cm$^{-3}$ to $2.0 \times 10^{18}$ cm$^{-3}$, the estimated lifetimes of the examples are approximately 70,000 hours or more.

On the other hand, when the carrier concentration in the optical guide layers is lower than $3.0 \times 10^{17}$ cm$^{-3}$, the element resistance increases with decrease in the carrier concentration. Therefore, it is possible to consider that the characteristics of the semiconductor laser element deteriorate due to the increase in the element resistance in the range of carrier concentrations below $3.0 \times 10^{17}$ cm$^{-3}$. In addition, when the carrier concentration in the optical guide layers exceeds $2.0 \times 10^{18}$ cm$^{-3}$, the amount of interlattice atoms which can produce non-radiative recombination centers increases. Therefore, it is possible to consider that the characteristics of the semiconductor laser element deteriorate due to the increase in the amount of the interlattice atoms in the range of carrier concentrations above $2.0 \times 10^{18}$ cm$^{-3}$.

The lower limit ($3.0 \times 10^{17}$ cm$^{-3}$) of the carrier concentration in the optical guide layers which realizes satisfactory characteristics of the semiconductor laser element is not substantially changed even when the dopant is changed. However, the upper limit of the carrier concentration in the optical guide layers which realizes satisfactory characteristics of the semiconductor laser element varies according to the activation efficiency of the dopant with regard to carrier production.

Next, the lifetime of the semiconductor laser element according to the described embodiment is evaluated with respect to the concentration of p-type carriers in the n-type cladding layer 20. For this purpose, the present inventor has also produced a plurality of second samples of the InAlGaP-based semiconductor laser element having the structure of the described embodiment, in a similar manner to the aforementioned plurality of first examples except that the crystal-growth temperature in the first crystal growth processes is fixed at 700° C., and the crystal-growth temperatures in the second and third crystal growth processes are changed in the range of 600 to 700° C., and the carrier concentration in the first and second optical guide layers 31 and 33 is fixed to $2.0 \times 10^{18}$ cm$^{-3}$.

After the production of the above plurality of second samples of the InAlGaP-based semiconductor laser element is completed, the present inventor has measured the p-type carrier concentrations in the n-type cladding layer 20 by secondary ion mass spectrometry (SIMS). During the production of the semiconductor laser element, the dopant atoms diffuse from the first optical guide layer 31 to the n-type cladding layer 20. There is a tendency that the p-type carrier concentration in the n-type cladding layer 20 increases with the crystal-growth temperatures in the second and third crystal growth processes. In the plurality of second samples of the InAlGaP-based semiconductor laser element produced as above, the measured values of the p-type carrier concentration in a portion of the n-type cladding layer 20 which contains the p-type dopant atoms fall in the range $2.0 \times 10^{16}$ cm$^{-3}$ to $2.0 \times 10^{18}$ cm$^{-3}$.

In addition, the present inventor has measured the estimated lifetimes of the plurality of second samples of the semiconductor laser element in a similar manner to the aforementioned first samples. The present inventor has confirmed that when the p-type carrier concentration in the portion of the n-type cladding layer 20 which contains the p-type dopant atoms is in the range $2.0 \times 10^{16}$ cm$^{-3}$ to $2.0 \times 10^{18}$ cm$^{-3}$, and the output power of the semiconductor laser element is as low as 5 to 10 mW, the estimated lifetime of the semiconductor laser element does not greatly vary with the p-type carrier concentration in the n-type cladding layer 20, and the estimated lifetimes of all the second samples are as long as 70,000 hours or more.

OTHER MATTERS (1) The semiconductor laser element according to the present invention can be used in various fields such as optical fiber communications, information processing, image processing, laser measurement, medicine, and printing. In particular, it is preferable to use the semiconductor laser element according to the present invention as a light source in the optical fiber communications.

(2) In addition, all the contents of the Japanese patent application No. 2005-082862 are incorporated into this specification by reference.

What is claimed is:

1. A semiconductor laser element comprising:
  a semiconductor substrate of a first conductivity type;
  a lower cladding layer of the first conductivity type formed above a surface of said semiconductor substrate;
  an optical guide layer formed above said lower cladding layer;
  a quantum-well active layer formed above said optical guide layer;
  an upper cladding layer of a second conductivity type formed above said quantum-well active layer;
  a contact layer of the second conductivity type formed above said upper cladding layer;
  a first electrode of the first conductivity type formed below said lower cladding layer; and
  a second electrode of the second conductivity type formed on said contact layer;
  wherein said optical guide layer has a first bandgap smaller than a second bandgap which said lower cladding layer has, and the whole or a portion of the optical guide layer contains a dopant so as to realize a carrier concentration of $3.0 \times 10^{17}$ cm$^{-3}$ or higher.

2. A semiconductor laser element according to claim 1, wherein said first conductivity type is an n-type, said second conductivity type is a p-type, said dopant is zinc, and said carrier concentration in the whole or said portion of the optical guide layer is $2.0 \times 10^{18}$ cm$^{-3}$ or lower.

3. A semiconductor laser element according to claim 1, wherein said first conductivity type is an n-type, said second conductivity type is a p-type, said dopant is a p-type dopant, and the whole or a portion of said lower cladding layer contains said dopant so as to realize a carrier concentration of $2.0 \times 10^{16}$ cm$^{-3}$ to $2.0 \times 10^{18}$ cm$^{-3}$.

4. A semiconductor laser element comprising:
   a semiconductor substrate of a first conductivity type;
   a lower cladding layer of the first conductivity type formed above a surface of said semiconductor substrate;
   a quantum-well active layer formed above said lower cladding layer;
   an optical guide layer formed above said quantum-well active layer;
   an upper cladding layer of a second conductivity type formed above said optical guide layer;
   a contact layer of the second conductivity type formed above said upper cladding layer;
   a first electrode of the first conductivity type formed below said lower cladding layer; and
   a second electrode of the second conductivity type formed on said contact layer;
   wherein said optical guide layer has a first bandgap greater than a second bandgap which said quantum-well active layer has, and the whole or a portion of the optical guide layer contains a dopant so as to realize a carrier concentration of $3.0 \times 10^{17}$ cm$^{-3}$ or higher.

5. A semiconductor laser element according to claim 4, wherein said first conductivity type is an n-type, said second conductivity type is a p-type, said dopant is zinc, and said carrier concentration in the whole or said portion of the optical guide layer is $2.0 \times 10^{18}$ cm$^{-3}$ or lower.

* * * * *